(12) United States Patent
Sexton et al.

(10) Patent No.: US 9,184,043 B2
(45) Date of Patent: *Nov. 10, 2015

(54) EDGE ELECTRODES WITH DIELECTRIC COVERS

(75) Inventors: Gregory S. Sexton, Fremont, CA (US); Andrew D. Bailey, III, Pleasanton, CA (US); Andras Kuthi, Thousand Oaks, CA (US); Yunsang Kim, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 964 days.

This patent is subject to a terminal disclaimer.

(21) Appl. No.: 11/758,584

(22) Filed: Jun. 5, 2007

(65) Prior Publication Data

US 2009/0166326 A1 Jul. 2, 2009

Related U.S. Application Data

(63) Continuation-in-part of application No. 11/440,561, filed on May 24, 2006, now Pat. No. 7,909,960.

(60) Provisional application No. 60/893,074, filed on Mar. 5, 2007, provisional application No. 60/893,069, filed on Mar. 5, 2007.

(51) Int. Cl.
*H01J 37/32* (2006.01)
*H01L 21/00* (2006.01)
(Continued)

(52) U.S. Cl.
CPC ..... *H01L 21/02087* (2013.01); *H01J 37/32009* (2013.01); *H01J 37/32082* (2013.01);
(Continued)

(58) Field of Classification Search
CPC .................. H01L 21/02087; H01L 21/02057; H01L 21/31116; H01L 21/31138; H01L 21/32136; H01J 37/32082; H01J 37/32862; H01J 37/32009; H01J 37/32559; H01J 37/32642

See application file for complete search history.

(56) References Cited

U.S. PATENT DOCUMENTS

| 5,273,588 A | 12/1993 | Foster et al. |
| 5,788,799 A | 8/1998 | Steger et al. |

(Continued)

FOREIGN PATENT DOCUMENTS

| JP | 07-142449 | * 2/1995 | |
| JP | Hei11-71680 | 3/1999 | ............... C23C 16/44 |

(Continued)

OTHER PUBLICATIONS

International Search Report (3 pages), Jun. 26, 2008.

*Primary Examiner* — Jeffrie R Lund
(74) *Attorney, Agent, or Firm* — Martine Penilla Group, LLP

(57) ABSTRACT

The embodiments provide apparatus and methods for removal of etch byproducts, dielectric films and metal films near the substrate bevel edge, and chamber interior to avoid the accumulation of polymer byproduct and deposited films and to improve process yield. In an exemplary embodiment, a plasma processing chamber configured to clean a bevel edge of a substrate is provided. The plasma processing chamber includes a substrate support configured to receive the substrate. The plasma processing chamber also includes a bottom edge electrode surrounding the substrate support. The bottom edge electrode and the substrate support are electrically isolated from one another by a bottom dielectric ring. A surface of the bottom edge electrode facing the substrate is covered by a bottom thin dielectric layer. The plasma processing chamber further includes a top edge electrode surrounding a top insulator plate opposing the substrate support. The top edge electrode is electrically grounded. A surface of the top edge electrode facing the substrate is covered by a top thin dielectric layer. The top edge electrode and the bottom edge electrode oppose one another and are configured to generate a cleaning plasma to clean the bevel edge of the substrate.

11 Claims, 4 Drawing Sheets

(51) Int. Cl.
  *H01L 21/311* (2006.01)
  *H01L 21/3213* (2006.01)
  *H01L 21/02* (2006.01)

(52) U.S. Cl.
  CPC ..... *H01J37/32559* (2013.01); *H01J 37/32642* (2013.01); *H01J 37/32862* (2013.01); *H01L 21/02057* (2013.01); *H01L 21/31116* (2013.01); *H01L 21/31138* (2013.01); *H01L 21/32136* (2013.01)

(56) References Cited

U.S. PATENT DOCUMENTS

| | | | |
|---|---|---|---|
| 6,478,924 B1* | 11/2002 | Shamouilian et al. | 156/345.48 |
| 6,646,857 B2* | 11/2003 | Anderson et al. | 361/234 |
| 6,647,993 B2 | 11/2003 | Shang et al. | 134/1.1 |
| 6,869,895 B1* | 3/2005 | Clevenger et al. | 438/787 |
| 7,535,688 B2* | 5/2009 | Yokouchi et al. | 361/56 |
| 7,909,960 B2* | 3/2011 | Kim et al. | 156/345.3 |
| 7,938,931 B2* | 5/2011 | Sexton et al. | 156/345.3 |
| 8,414,790 B2* | 4/2013 | Bailey et al. | 216/100 |
| 8,580,078 B2* | 11/2013 | Bailey et al. | 156/345.43 |
| 2001/0006070 A1 | 7/2001 | Shang et al. | 134/1 |
| 2001/0042513 A1 | 11/2001 | Kao et al. | 118/723 |
| 2004/0000875 A1* | 1/2004 | Vahedi et al. | 315/111.71 |
| 2004/0137745 A1* | 7/2004 | Houghton et al. | 438/706 |
| 2004/0238488 A1* | 12/2004 | Choi et al. | 216/58 |
| 2005/0039682 A1* | 2/2005 | Dhindsa et al. | 118/723 E |
| 2005/0070105 A1* | 3/2005 | Bailey et al. | 438/689 |
| 2005/0173067 A1* | 8/2005 | Lim | 156/345.32 |
| 2005/0178505 A1 | 8/2005 | Kim | |
| 2005/0263484 A1 | 12/2005 | Park et al. | |
| 2006/0086461 A1 | 4/2006 | Inada et al. | |
| 2006/0118518 A1 | 6/2006 | Rusu et al. | 216/67 |
| 2007/0012659 A1 | 1/2007 | Rusu et al. | 216/58 |
| 2007/0068623 A1* | 3/2007 | Kim et al. | 156/345.3 |
| 2007/0068900 A1* | 3/2007 | Kim et al. | 216/67 |
| 2007/0186855 A1* | 8/2007 | Dhindsa | 118/723 E |
| 2008/0179010 A1* | 7/2008 | Bailey, III et al. | 156/345.43 |
| 2009/0114294 A1* | 5/2009 | Sexton et al. | 134/1.1 |
| 2009/0166326 A1* | 7/2009 | Sexton et al. | 216/67 |
| 2009/0188627 A1* | 7/2009 | Fang et al. | 156/345.43 |
| 2010/0213173 A1* | 8/2010 | Bailey et al. | 216/87 |
| 2011/0146703 A1* | 6/2011 | Chen et al. | 134/1.1 |

FOREIGN PATENT DOCUMENTS

| | | | |
|---|---|---|---|
| JP | 2001-44147 A | 2/2001 | |
| JP | 2002520835 | 7/2002 | C23C 16/44 |
| KR | 10-2007-0001493 | 1/2007 | |

* cited by examiner

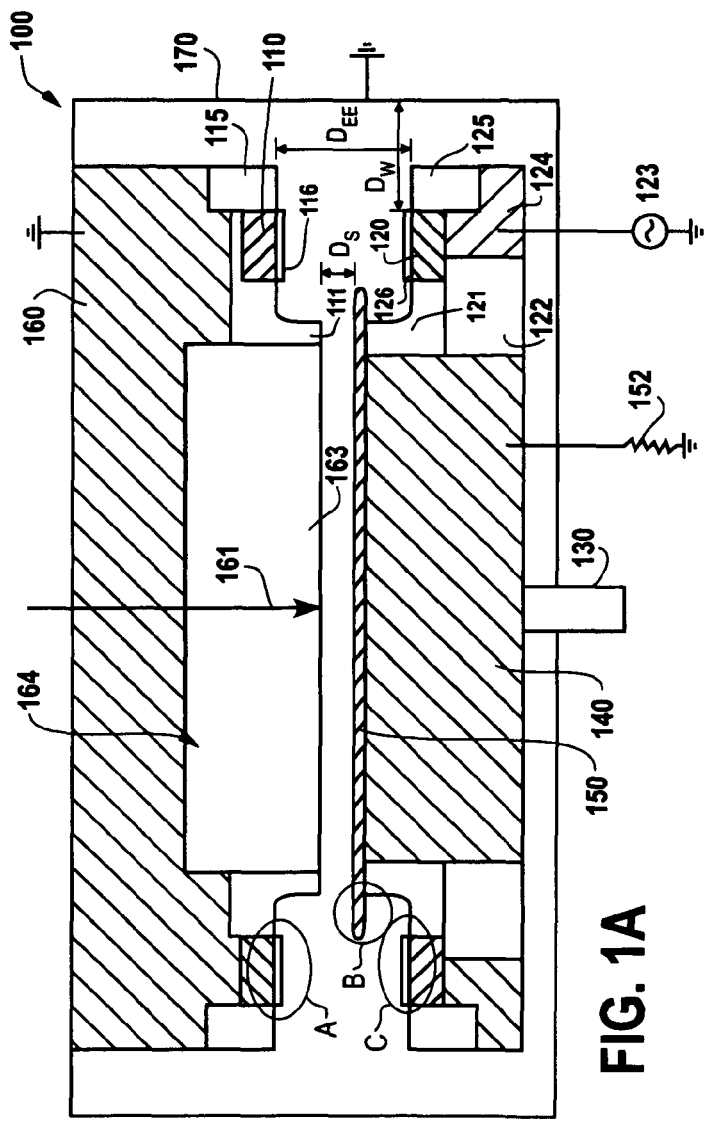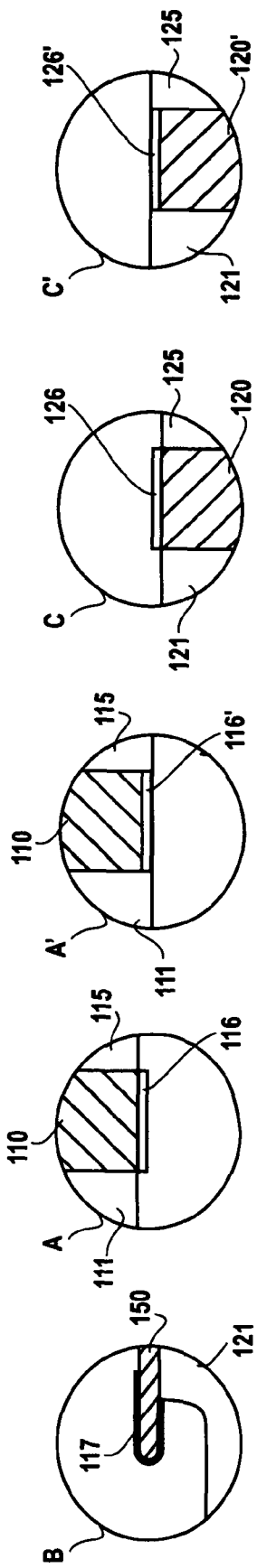

EDGE ELECTRODES WITH DIELECTRIC COVERS

CLAIM OF PRIORITY

This application is a continuation-in-part of U.S. patent application Ser. No. 11/440,561 filed on May 24, 2006 now U.S. Pat. No. 7,909,960, and titled "Apparatus and Methods to Remove Films on Bevel Edge and Backside of Wafer." This application claims the priority of U.S. Provisional Application No. 60/893,074, filed on Mar. 5, 2007, and titled "Edge Electrodes with Dielectric Covers," and U.S. Provisional application No. 60/893,069, filed on Mar. 5, 2007, and titled "Edge Electrodes with Variable Power." These applications are incorporated herein by reference in their entireties for all purposes.

CROSS REFERENCE TO RELATED APPLICATIONS

This application is related to: (1) U.S. patent application Ser. No. 11/758,576, filed on the same date with this application and entitled "EDGE ELECTRODES WITH VARIABLE POWER", and (2) U.S. patent application Ser. No. 11/704,870, filed on Feb. 8, 2007 and entitled "METHODS OF AND APPARATUS FOR ALIGNING ELECTRODES IN A PROCESS CHAMBER TO PROTECT AN EXCLUSION AREA WITHIN AN EDGE ENVIRON OF A WAFER", both of which are incorporated herein by reference.

This application is also related to: (3) U.S. patent application Ser. No. 11/701,854, filed on Feb. 2, 2007 and entitled "APPARATUS FOR DEFINING REGIONS OF PROCESS EXCLUSION AND PROCESS PERFORMANCE IN A PROCESS CHAMBER"; and (4) U.S. patent application Ser. No. 11/697,695, filed on Apr. 6, 2007 and entitled "METHOD AND SYSTEM FOR DISTRIBUTING GAS FOR A BEVEL EDGE ETCHER", both of which are incorporated herein by reference.

BACKGROUND

The present invention relates in general to substrate manufacturing technologies and in particular to apparatus and methods for the removal etch byproducts from a bevel edge of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies of square or rectangular shapes. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield. In addition, the interior of the process chamber, such as chamber walls, can also accumulate etch byproduct polymers, which needs to be removed periodically to avoid byproducts accumulation and chamber particle issues.

In view of the foregoing, there is a need for apparatus and methods that provide improved mechanisms of removal of etch byproducts, dielectric films and metal films near the substrate bevel edge, and chamber interior to avoid accumulation of polymer byproducts and deposited films and to improve process yield.

SUMMARY

Broadly speaking, the disclosed embodiments fill the need by providing improved mechanisms of removal of etch byproducts, dielectric films and metal films near the substrate bevel edge, and chamber interior to avoid the accumulation of polymer byproduct and deposited films and to improve process yield. It should be appreciated that the present invention can be implemented in numerous ways, including as a process, an apparatus, or a system. Several inventive embodiments of the present invention are described below.

In one embodiment, a plasma processing chamber configured to clean a bevel edge of a substrate is provided. The plasma processing chamber includes a substrate support configured to receive the substrate. The plasma processing chamber also includes a bottom edge electrode surrounding the substrate support. The bottom edge electrode and the substrate support are electrically isolated from one another by a bottom dielectric ring. A surface of the bottom edge electrode facing the substrate is covered by a bottom thin dielectric layer. The plasma processing chamber further includes a top edge electrode surrounding a top insulator plate opposing the substrate support. The top edge electrode is electrically grounded. A surface of the top edge electrode facing the substrate is covered by a top thin dielectric layer. The top edge electrode and the bottom edge electrode oppose one another and are configured to generate a cleaning plasma to clean the bevel edge of the substrate.

In another embodiment, a method of cleaning a bevel edge of a substrate in a processing chamber is provided. The method includes placing a substrate on a substrate support in the processing chamber, and flowing a cleaning gas into the processing chamber. The method also includes generating a cleaning plasma near the bevel edge of the substrate to clean the bevel edge by powering a bottom edge electrode with a RF power source and by grounding a top edge electrode. The bottom edge electrode surrounds the substrate support. The bottom edge electrode and the bottom electrode are electrically isolated from one another by a bottom dielectric ring. A surface of the bottom edge electrode facing the substrate is covered by a bottom thin dielectric layer. The top edge electrode surrounds an insulator plate, which opposes the substrate support. A surface of the top edge electrode facing the substrate is covered by a top thin dielectric layer.

In yet another embodiment, a method of cleaning a chamber interior of a processing chamber is provided. The method includes removing a substrate from the processing chamber, and flowing a cleaning gas into the processing chamber. The method also includes generating a cleaning plasma in the processing chamber to clean the chamber interior by powering a bottom edge electrode with a RF power source and by grounding a top edge electrode. The bottom edge electrode surrounds the substrate support. The bottom edge electrode and the bottom electrode are electrically isolated from one another by a bottom dielectric ring. A surface of the bottom edge electrode facing the substrate is covered by a bottom thin dielectric layer. The top edge electrode surrounding an insulator plate which opposes the substrate support. A surface of the top edge electrode facing the substrate is covered by a top thin dielectric layer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1A shows a schematic diagram of a substrate etching system with a pair of top and bottom edge electrodes, in accordance with one embodiment of the present invention.

FIG. 1B shows an enlarged region B of FIG. 1A, in accordance with one embodiment of the present invention.

FIG. 1C shows an enlarged region A of FIG. 1A, in accordance with one embodiment of the present invention.

FIG. 1C-1 shows an enlarged region A of FIG. 1A, in accordance with another embodiment of the present invention.

FIG. 1D shows an enlarged region C of FIG. 1A, in accordance with one embodiment of the present invention.

FIG. 1D-1 shows an enlarged region C of FIG. 1A, in accordance with another embodiment of the present invention.

DETAILED DESCRIPTION OF THE EXEMPLARY EMBODIMENTS

Several exemplary embodiments for improved structures and mechanisms to remove etch byproducts, dielectric films and metal films near the substrate bevel edge, and chamber interior, to avoid polymer byproduct and film accumulation and to improve process yield are provided. It will be apparent to those skilled in the art that the present invention may be practiced without some or all of the specific details set forth herein.

Figure 1F:
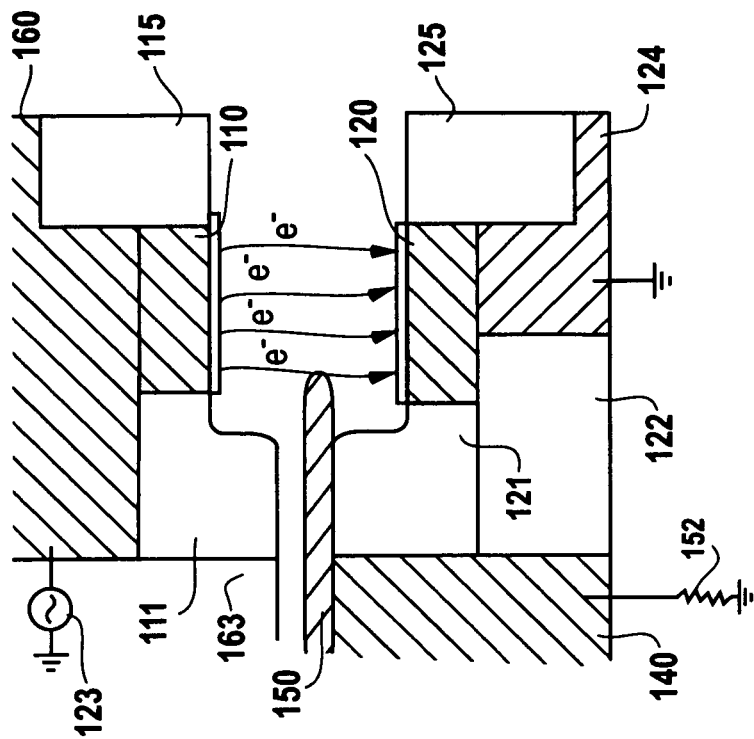
FIG. 1F shows the bevel edge cleaning plasma generated by RF powered bottom electrode and grounded top edge electrode, in accordance with another embodiment of the present invention.

FIG. 1A shows a cleaning chamber 100 for cleaning substrate bevel edge, in accordance with one embodiment of the present invention. Cleaning chamber 100 has a substrate support 140 with a substrate 150 on top. In one embodiment, the substrate support 140 is an electrode. Under such circumstance, the substrate support 140 can also be called a bottom electrode. In another embodiment, the substrate support 140 is an electrostatic chuck. Opposing the substrate support 140 is an insulator plate 163. The insulator plate 163 can also be called a top insulator plate 163. In one embodiment, there is a gas feed 161 coupled to the center of the insulator plate 163 to provide process gas. Alternatively, process gas can also be supplied to the edge of substrate 150 through other configurations. The substrate support 140 is either made of an insulating material or being coupled to a resistor 152 with high resistance value, if the substrate support 140 is made of a conductive material. In one embodiment, the resistance of the resistor is greater than 1 Mohm. The substrate support 140 is kept to having a high resistivity to prevent drawing RF power from the RF power source coupled to one of the edge electrodes. The substrate 150 has a bevel edge 117 that includes a top and a bottom surface of the edge of the substrate, as shown in region B of FIG. 1A and enlarged region B in FIG. 1B. In FIG. 1B, bevel edge 117 is highlighted as a bold solid line and curve.

Surrounding the edge of substrate support 140, there is a bottom edge electrode 120, which can be made of conductive materials, such as aluminum (Al), anodized aluminum, silicon (Si), and silicon carbide (SiC). The surface of the bottom edge electrode 120 is covered by a thin dielectric layer 126. In one embodiment, the thickness of the thin dielectric layer 126 is between about 0.01 mm and about 1 mm. In another embodiment, the thickness is between about 0.05 mm and about 0.1 mm. The thin dielectric layer 126 can be applied or formed in a number of ways, and one way can be through a deposition process. Alternatively, the thin dielectric layer 126 can be formed separately from the bottom edge electrode 120 and can be amounted on the bottom edge electrode 120.

To perform the deposition process, the bottom edge electrode 120 is placed into a chamber where oxide growing chemicals are flown in to promote the formation of the thin dielectric layer 126. In one embodiment, dielectric material of the thin dielectric layer 126 is a type of silicon dioxide. The thin dielectric layer 126 can also be defined by other types of materials, including without limitation yttrium oxide ($Y_2O_3$), alumina ($Al_2O_3$), silicon carbide (SiC). In one embodiment, the thin dielectric layer 126 is provided to reduce contamination in the process chamber. For example, if the bottom electrode 120 is a made of aluminum (Al), aluminum would form compounds such as aluminum fluoride ($AlF_3$) with plasmarized radicals, such as fluorine radicals, in the cleaning plasma. The fluorine radicals would corrode the electrode.

When aluminum fluoride grows to a certain size, it would flake off the electrode and create particles in the processing chamber. Therefore, it is desirable to have a cover for the bottom electrode 120. The cover material should be stable (or inert) in the cleaning plasma. The thin dielectric cover 126 would reduce particle problems for the processing chamber and increase device yield.

Between the substrate support 140 and the bottom edge electrode 120, there is a bottom dielectric ring 121 electrically separating the substrate support 140 and the bottom edge electrode 120. In one embodiment, substrate 150 is not in contact with the bottom edge electrode 120. Beyond the bottom edge electrode 120, there is another bottom insulating ring 125, which extends the surface of the bottom edge electrode 120 facing substrate 150. The bottom dielectric ring 121 and the bottom insulating ring 125 can be made of insulating materials, such as a ceramic or alumina ($Al_2O_3$). The bottom edge electrode 120 is electrically and physically coupled to a lower focus ring 124. In one embodiment, the lower focus ring 124 is electrically coupled to the RF power supply 123 for the substrate support 140. The lower focus ring 124 is electrically and physically separated from the substrate support 140 by an isolation ring 122. In one embodiment, the isolation ring 122 is made of a dielectric material, such as ceramic or alumina. The bottom edge electrode 120 is RF powered through the lower focus ring 124 by an RF power source 123. The substrate support 140 is coupled to a moving mechanism 130 that enables the bottom electrode assembly to move up or down. In this example, the bottom electrode assembly includes the substrate support 140, the bottom edge electrode 120, the bottom dielectric ring 121, the bottom insulating ring 125, and the isolation ring 122.

Surrounding the insulator plate 163 is a top edge electrode 110, opposing the lower edge electrode 120. The top edge electrode 110 can be made of conductive materials, such as aluminum (Al), anodized aluminum, silicon (Si), and silicon carbide (SiC). In one embodiment, between the top edge electrode 110 and the insulator plate 163 is a top dielectric ring 111. Beyond the top edge electrode 110, there is top insulating ring 115, which extends the surface of the top edge electrode 110 facing substrate 150. The top edge electrode 110 is electrically and physically coupled to a top electrode 160, which is grounded. In addition, the chamber walls 170 are grounded. The top electrode 160, the top edge electrode 110, the top dielectric ring 111, the top insulating ring 115, and the isolation ring 112, and the insulator plate 163 form a top electrode assembly. In another embodiment, the top electrode 160 is RF powered and the bottom edge electrode 120 is electrically grounded.

Based on the same reasons noted above for the thin dielectric layer 126, the surface of the top edge electrode 110 is also covered by a thin dielectric layer 116. In one embodiment, the thickness of the thin dielectric layer 116 is in about the same range as the thin dielectric layer 126 noted above. The thin dielectric layer 116 is disposed over the top edge electrode 110. The deposition and formation processes, and materials noted with respect to thin dielectric layer 126 also apply to thin dielectric layer 116.

FIG. 1C shows an encircled region A of FIG. 1A, which shows the top edge electrode 110 with the thin dielectric covering layer 116, in accordance with one embodiment of the present invention. Alternatively, the surface of the thin dielectric covering layer 116' is flush with the surface of the top dielectric ring 111 and the surface of the top insulating ring 115, as shown in FIG. 1C-1. FIG. 1D shows an encircled region C of FIG. 1A, which shows the bottom edge electrode 120 with the thin dielectric layer covering layer 126, in accordance with one embodiment of the present invention. Alternatively, the surface of the thin bottom dielectric covering layer 126' is flush with the surface of the bottom dielectric ring 121 and the surface of the bottom insulating ring 125, as shown in FIG. 1D-1. During bevel edge cleaning, the top edge electrode 110 is grounded through the top electrode 160. The bottom edge electrode 120 is powered by the RF source 123. In one embodiment, the RF power is between about 2 MHz to about 60 MHz.

As described above, the thin dielectric layer 126 over bottom edge electrode 120 and the thin dielectric layer 116 over the top edge electrode 110 protect the bottom edge electrode 120 and the top edge electrode 110 from being corroded and reduce particle counts in the processing chamber. The thicknesses of the thin dielectric layers 126, 116 should be kept low enough that the bottom edge electrode 120 and top edge electrode 110 can still function as electrodes. As described above, the thicknesses for thin dielectric layers 126 and 116 are between about 0.01 mm and about 1 mm. In another embodiment, thicknesses for thin dielectric layers 126 and 116 are between about 0.05 mm and about 0.1 mm. The thin dielectric layer 126 can be applied or formed in a number of ways, and one way can be through a deposition process. Other methods include spraying the thin dielectric layer over the edge electrodes. Alternatively, the thin dielectric layer 126 can be formed separately form the bottom edge electrode 120 and be amounted on the bottom edge electrode 120, in accordance with one embodiment of the present invention.

The space between the substrate 150 and the insulating plate 160 is kept small, such as less than 1.0 mm, so that no plasma would generate between on the substrate surface that is beneath the insulating plate 160. The top insulating ring 115 and bottom insulating ring 125 also help confine the plasma generated be confined near the bevel edge.

The space between the substrate 150 and the insulating plate 163 is kept very small, such as less than 1.0 mm, so that no plasma would generate between on the substrate surface that is beneath the insulating plate 160. A plasma can be generated near the edge of the substrate 150 to clean the bevel edge, with the grounded top edge electrode 110 providing returning electrical paths, as shown in FIG. 1E.

Figure 1E:
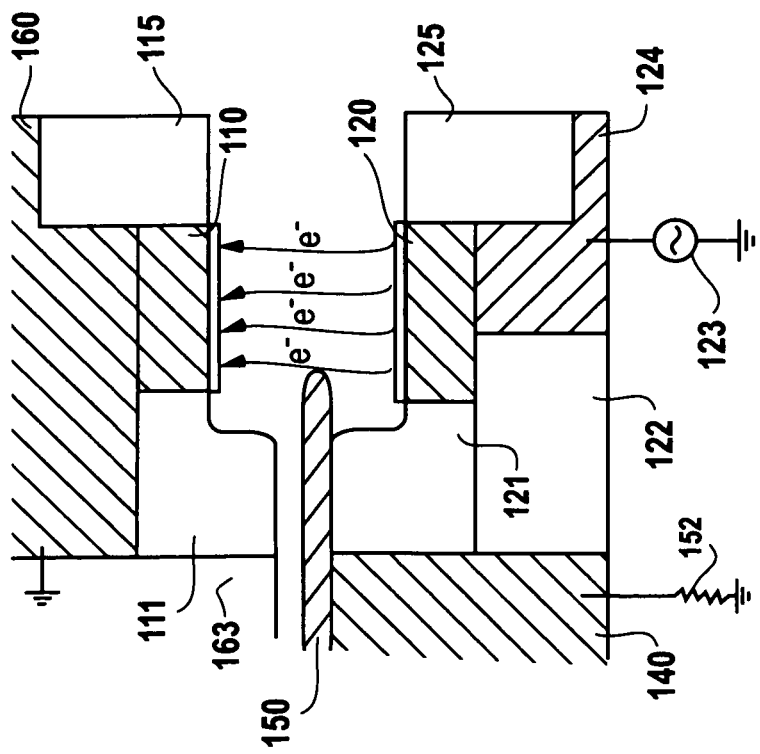
FIG. 1E shows the bevel edge cleaning plasma generated by RF powered bottom electrode and grounded top edge electrode, in accordance with one embodiment of the present invention.

A plasma can be generated near the edge of the substrate 150 to clean the bevel edge, with the grounded top edge electrode 110 providing returning electrical paths, as shown in FIG. 1E, in accordance with one embodiment of the present invention. Other arrangement of power supply and grounding can also be used. For example, the top edge electrode 110 is RF powered, by coupling a RF power supply to the top electrode 160, and the bottom edge electrode 120 is electrically grounded, by grounding the lower focus ring 124, as shown in FIG. 1E in accordance with one embodiment of the present invention. The key point is both the top edge electrode and the bottom edge electrode are each covered by a thin dielectric layer to protect the surfaces of the edge electrodes. Bottom dielectric ring 121 is shown to have a first level at a height of the substrate support 140 and a second level at a height of the bottom electrode. Top dielectric ring 111 has a first level at a height of the insulator plate 163 and a second level at a height of the top edge electrode 110. A step is therefore shown between the first and second levels of the bottom and top dielectric rings.

During a substrate bevel edge cleaning process, the RF power source 123 supplies RF power at a frequency between about 2 MHz to about 60 MHz and a power between about 100 watts to about 2000 watts to generate a cleaning plasma. The cleaning plasma is configured to be confined by the top dielectric ring 111, top edge electrode 110, the top insulating ring 115, the bottom dielectric ring 121, the bottom edge electrode 120, and the bottom insulating ring 125. The cleaning gas(es) is supplied through the gas feed 161 near the center of the insulator plate 163. Alternatively, the cleaning gas(es) can also be supplied through gas feed(s) disposed in other parts of the process chamber 100.

To clean etch byproduct polymers, cleaning gases can include an oxygen-containing gas, such as $O_2$. Some amount, such as <10%, of a fluorine-containing gas, such as $CF_4$, $SF_6$, or $C_2F_6$, can also be added to clean the polymer in one embodiment. It should be appreciated that nitrogen-containing gas, such as $N_2$, can also be included in the gas mixture. The nitrogen-containing gas assists dissociation of the oxygen-containing gas. An inert gas, such as Ar or He, can also be added to dilute the gas and/or to maintain the plasma. To clean a dielectric film(s), such as SiN or $SiO_2$, at the bevel edge 117, a fluorine-containing gas, such as $CF_4$, $SF_6$, or a combination of both gases, can be used. An inert gas, such as Ar or He, can also be used to dilute the fluorine-containing gas and/or to maintain the cleaning plasma. To clean a metal film(s), such as Al or Cu, at the bevel edge 117, a chlorine-containing gas, such as $Cl_2$, or $BCl_3$, or a combination of both gases, can be used. An inert gas, such as Ar or He, can also be used to dilute the chlorine-containing gas and/or to maintain the plasma to clean the metal film(s).

In one embodiment, the space (or distance) between the top edge electrode 110 and the bottom edge electrode 120, $D_{EE}$, is relatively small compared to the distance to nearest ground ($D_W$) of the bottom edge electrode 120 or top edge electrode 110. In one embodiment, the space $D_{EE}$ is between about 0.5 cm to about 2.5 cm. In one embodiment, the ratio of $D_W/D_{EE}$ is greater than about 4:1, which ensures plasma confinement. In one embodiment, $D_W$ is the distance from the bottom edge electrode 120 to the near grounded chamber wall 170. The chamber pressure is kept between about 100 mTorr to about 2 Torr during the bevel edge cleaning process. In one embodiment, the spacing between the insulator plate 163 and substrate 150, $D_S$, is less than about 1.0 mm to ensure no plasma is formed between the top electrode 160 and the substrate 150 during the bevel edge cleaning process. In another embodiment, $D_S$ is less than 0.4 mm.

The plasma generated in FIG. 1E is a capacitively coupled cleaning plasma. Alternatively, the bottom edge electrode 120 can be replaced with an inductive coil buried in a dielectric material. The plasma generated to clean the bevel edge can be an inductively coupled plasma (generated by the bottom edge electrode 120). Inductive coupled plasma generally has a higher density than capacitively coupled plasma and can efficiently clean the bevel edge.

The plasma generated near the substrate edge and between the top edge electrode 110 and the bottom edge electrode 120 cleans the substrate bevel edge of the substrate. The cleaning helps reduce the build-up of polymer at the substrate bevel edge, which reduces or eliminates the possibility of particle defects impacting device yield. Making the entire bottom edge electrode and the top edge electrode with materials inert to the cleaning plasma could be very costly. In contrast, using a thin dielectric layer is a lot more cost effective. As described above, the thin dielectric layer can be mounted on the bottom edge electrode and the top edge electrode. If a different cleaning chemistry is used and the original thin dielectric layer is no longer inert to the new cleaning chemistry, the thin covers placed on the edge electrodes can be easily replaced with covers made of materials that are inert to the new chemistry. This saves the money and time needed to remake the entire bottom edge electrode and the top edge electrode. In addition, after a period of usage, the surfaces of the bottom edge electrode and the top edge electrode can be cleaned or sanded. New layers (or coating) of dielectric layers can be put on the edge electrodes. The edge electrodes can be kept unaffected with extended processing time.

Figure 2A:
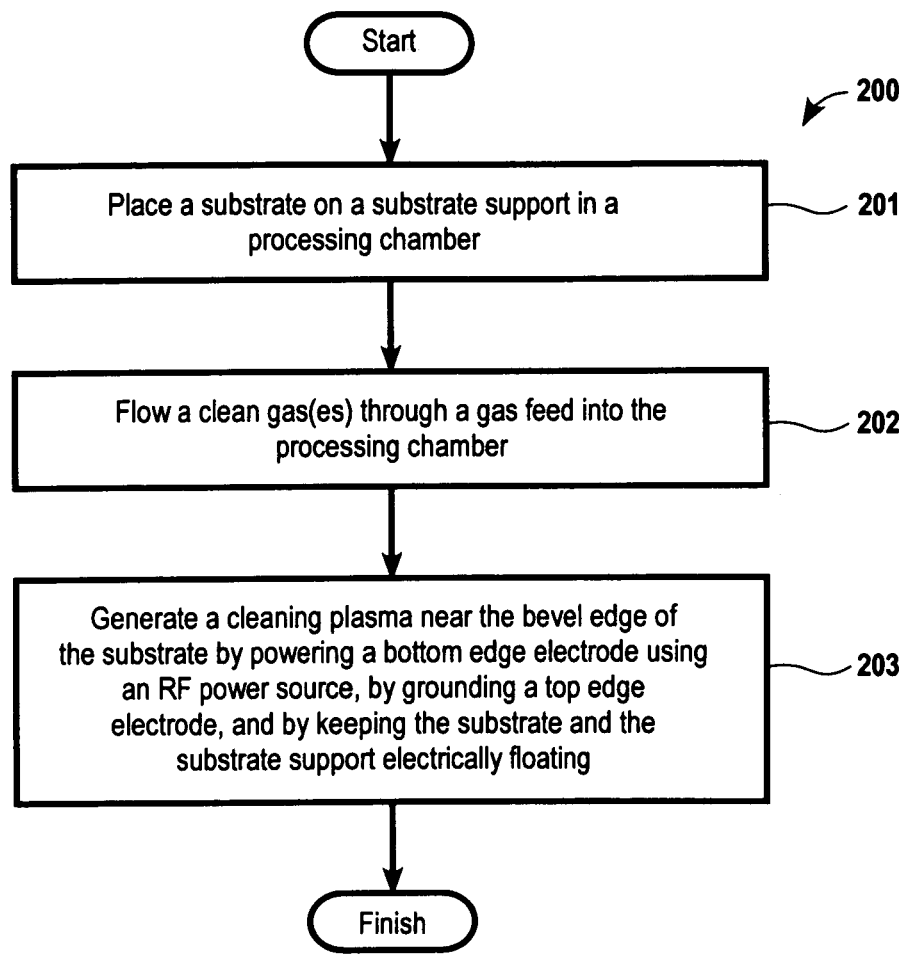
FIG. 2A shows a process flow of generating a bevel edge cleaning plasma, in accordance with one embodiment of the present invention.

FIG. 2A shows an embodiment of a process flow 200 for cleaning the bevel edge of the substrate. The process starts at step 201 by placing a substrate on a substrate support in a processing chamber. The process is followed by flowing a cleaning gas(es) through a gas feed into the processing chamber at step 202. At step 203, a cleaning plasma is then generated near the bevel edge of the substrate by powering a bottom edge electrode using a RF power source and by grounding a top edge electrode. The substrate support is either made of a dielectric material or being coupled to a resistor 152 with high resistance value to prevent drawing RF power from the bottom edge electrode to the substrate support. A different process flow can be used, where the bottom edge electrode is electrically grounded and the top edge electrode is powered by an RF power source, in accordance with another embodiment of the present invention. A cleaning plasma to clean bevel edge can also be generated in this configuration.

The configuration shown in FIG. 1A can also be used generate plasma to clean the chamber interior. During the chamber interior cleaning, the substrate 150 is removed from the process chamber 100. Therefore, the process can also be called waferless autoclean (WAC). In one embodiment, the pressure in the process chamber is kept below 500 mTorr. The lower chamber pressure allows the cleaning plasma to diffuse through out the chamber interior. For waferless autoclean (or called chamber interior clean), the distance requirement between the insulator plate 163 and substrate 150, $D_S$, to be less than about 1.0 mm, is no longer needed. Similarly, the space requirement between the top edge electrode 110 and the bottom edge electrode 120, $D_{EE}$, of between about 0.5 cm to about 2.5 cm is also not needed. Chamber interior leaning plasma does not need to be confined between the top edge electrode 110 and bottom edge electrode 120 or between the top insulating ring 115 and bottom insulating ring 125. The cleaning plasma needs to diffuse through out the chamber interior to clean thoroughly.

As described above, to clean the bevel edge, the frequency of RF power used is between about 2 MHz to about 60 MHz, or a mixture of frequencies. To clean the chamber interior, the frequency of RF power is between about 2 MHz to about 60 MHz, or a mixture of frequencies. The plasma used to clean chamber interior normally has a higher plasma density than the plasma used to clean bevel edge; therefore, the RF power used to clean chamber interior has higher frequency(ies) than the RF power used to clean bevel edge. In one embodiment, the RF source 123 is a dual frequency power generator.

Different chemistries can be applied to perform WAC, depending on the residues accumulated in the chamber interior. The accumulated residue can be photoresist, dielectric materials, such as oxide and nitride, or conductive materials, such as tantalum, tantalum nitride, aluminum, silicon, or copper. The materials mentioned here are only examples. The inventive concept can also be applied to other applicable dielectric materials or conductive materials.

Figure 2B:
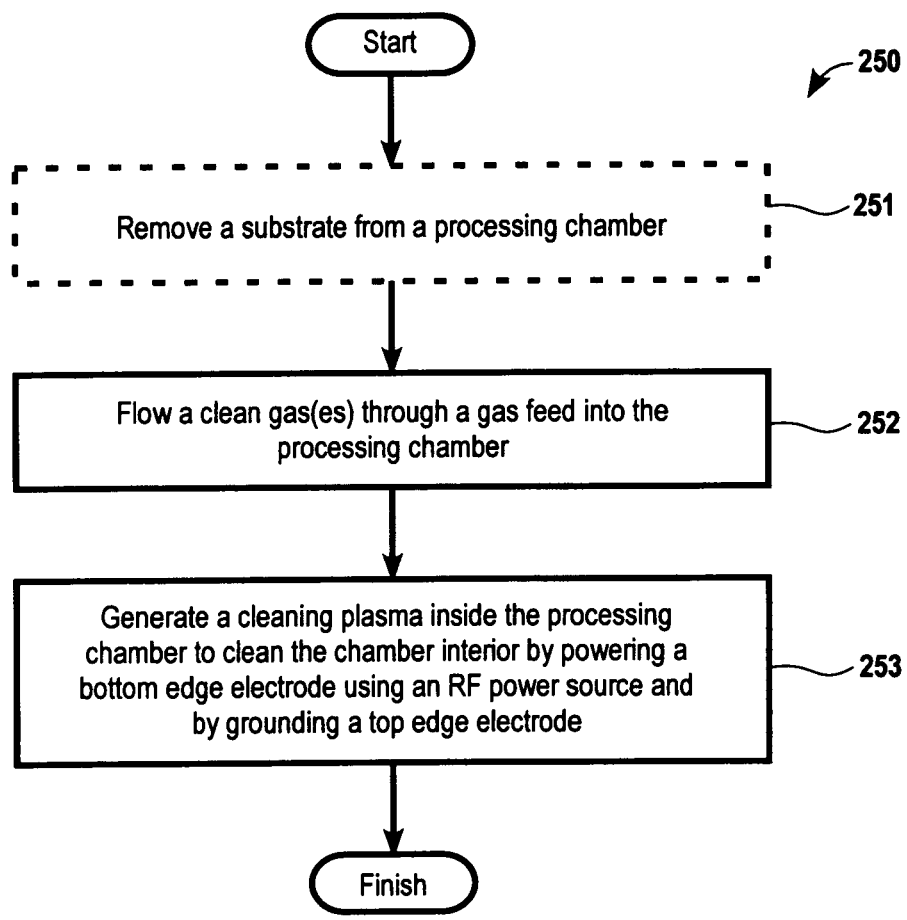
FIG. 2B shows a process flow of generating a chamber interior cleaning plasma, in accordance with one embodiment of the present invention.

FIG. 2B shows an embodiment of a process flow 250 for cleaning the bevel edge of the substrate. The process starts at an optional step 251 by removing a substrate from a processing chamber, assuming there is a substrate in the processing chamber. If there is not substrate (or wafer) in the processing chamber, a chamber interior clean (or WAC) can still be initiated. Under this circumstance, step 251 is not needed. The process is followed by flowing a cleaning gas(es) through a gas feed into the processing chamber at step 252. At step 253, a cleaning plasma is then generated inside the processing chamber by powering the bottom edge electrode using a RF power source, and grounding a top edge electrode. If the substrate support 140 is made of a conductive material, the substrate support 140 can be coupled to a resistor 152 with high resistance value, such as greater than about 1 Mohm, to prevent drawing RF power to the substrate support 140. Alternatively, the substrate support 140 can be grounded.

A different process flow can be used, where the bottom edge electrode is electrically grounded and the top edge electrode is powered by an RF power source, in accordance with another embodiment of the present invention. A cleaning plasma to clean chamber interior can also be generated in this configuration.

The improved apparatus and methods for cleaning of bevel edge, and chamber interior reduce undesirable build-up of etch by-products and deposited films on the substrate or chamber interior and enhance the device yields. Due to the thin dielectric covers that are made of material(s) inert to the etching chemistry, corrosion of bottom edge electrode and to edge electrode is prevented or reduced. With the thin dielectric layers covering the top edge electrode and bottom edge electrode, particle counts in the processing chamber are reduced.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing chamber configured to clean a bevel edge of a substrate, comprising:
    a substrate support configured to receive the substrate;
    a bottom edge electrode surrounding the substrate support, the bottom edge electrode and the substrate support being electrically isolated from one another by a bottom dielectric ring, a surface of the bottom edge electrode, facing the substrate, being covered by a bottom thin dielectric layer, the bottom dielectric ring having a step defined between a first level disposed at a height of the substrate support and a second level disposed at a height of the bottom edge electrode;
    a bottom insulating ring surrounding the bottom edge electrode;
    a top edge electrode surrounding a top insulator plate that is opposing the substrate support, the top edge electrode being electrically grounded, the top edge electrode and the top insulator plate isolated from one another by a top dielectric ring; and
    a top insulating ring surrounding the top edge electrode;
    wherein a surface of the top edge electrode facing the substrate being covered by a top thin dielectric layer, the top edge electrode and the bottom edge electrode opposing one another;
    wherein during operation a cleaning plasma to clean the bevel edge of the substrate is generated between the top edge electrode and the bottom edge electrode, wherein generation of the cleaning plasma uses a gas chemistry that is introduced into the plasma processing chamber from a center feed in the top insulator plate that allows the gas chemistry to flow over the substrate toward the bevel edge of the substrate;
    wherein a surface of the top insulating ring that faces the substrate aligns with the surface of the top edge electrode that faces the substrate; and
    wherein a surface of the bottom insulating ring that faces the top insulating ring aligns with the surface of the bottom edge electrode that opposes the top edge electrode, wherein the top insulating ring and the bottom insulating ring confine the cleaning plasma generated by the top edge electrode and the bottom edge electrode;
    wherein the bottom edge electrode is coupled to an RF power supply;
    wherein the separation distance between the top edge electrode and the bottom edge electrode is ($D_{EE}$), and a nearest round distance ($D_W$) is a distance to a chamber wall of the plasma processing apparatus and one of the top or bottom edge electrodes, wherein a ratio of $D_W/D_{EE}$ is at least 4:1.

2. The plasma processing chamber of claim 1, wherein the thickness of the top thin dielectric layer and the bottom thin dielectric layer both are between about 0.01 mm to about 1 mm.

3. The plasma processing chamber of claim 1, wherein a frequency of a RF power provided by the RF power supply is between about 2 MHz and about 60 MHz.

4. The plasma processing chamber of claim 1, wherein the bottom thin dielectric layer and the top thin dielectric layer are made of a material inert to the cleaning plasma to prevent corrosion of the top edge electrode and the bottom edge electrode and to reduce particle counts in the processing chamber.

5. The plasma processing chamber of claim 4, wherein the material is selected from the group consisting of yttrium oxide ($Y_2O_3$), alumina ($Al_2O_3$), silicon carbide (SiC).

6. The plasma processing chamber of claim 1, wherein the substrate support is made of a conductive material and is coupled to a resistor with a resistance greater than about 1 Mohm.

7. The plasma processing chamber of claim 1, wherein the distance between the top insulator plate and a surface of the substrate facing the insulator plate is less than about 1 mm.

8. The plasma processing chamber of claim 1, wherein the distance between the top edge electrode and the bottom edge electrode is between about 0.5 cm to about 2.5 cm.

9. A plasma processing apparatus for cleaning of a bevel edge of a substrate, comprising:
    in a chamber, including,
        a substrate support for supporting a substrate;
        a top insulator plate positioned over the substrate support, a distance between a surface of a wafer when disposed over the substrate support and the top insulator plate is set to less than about 1 mm;
        a top dielectric ring surrounding the top insulator plate;
        a top edge electrode configured to surround the top dielectric ring, the top dielectric ring having a step defined between a first level disposed at a height of the top insulator plate and a second level disposed at a height of the top edge electrode;
        a top insulating ring surrounding the top edge electrode;
        a bottom dielectric ring surrounding the substrate support;
        a bottom edge electrode surrounding the bottom dielectric ring, the bottom dielectric ring having a step defined between a first level disposed at a height of the substrate support and a second level disposed at a height of the bottom edge electrode; and
        a bottom insulating ring surrounding the bottom electrode;

wherein each of the top and bottom edge electrodes have a dielectric layer disposed on respective surfaces, the respective surfaces arranged to face one another;

wherein the top and bottom edge electrodes set to a separation distance of between about 0.5 cm and about 2.5 cm, the separation distance defining an area for producing a plasma to process a bevel edge of the substrate when present and when the chamber is in operation;

wherein the top insulator plate includes a gas feed in the center to enable introduction of a gas chemistry into the plasma processing apparatus, the gas chemistry configured to flow over the substrate to the bevel edge of the substrate to produce the plasma between the top and bottom edge electrodes;

wherein each of the bottom insulating ring and the top insulating ring have surfaces that face each other and radially extend outward from respective surfaces of the bottom edge electrode and top edge electrode to define a extended confinement region;

wherein the bottom edge electrode is coupled to an RF power supply and the top edge electrode is electrically grounded;

wherein the separation distance between the top edge electrode and the bottom edge electrode is ($D_{EE}$), and a nearest ground distance ($D_W$) is a distance to a chamber wall of the plasma processing apparatus and one of the top or bottom edge electrodes, wherein a ratio of $D_W/D_{EE}$ is at least 4:1.

10. The plasma processing apparatus of claim 9, wherein the dielectric layer is selected from the group consisting of yttrium oxide ($Y_2O_3$), alumina ($Al_2O_3$), silicon carbide (SiC).

11. The plasma processing apparatus of claim 9, wherein a frequency of a RF power provided by the RF power supply is between about 2 MHz and about 60 MHz.

\* \* \* \* \*